United States Patent [19]

Epstein et al.

[11] Patent Number: 4,998,013

[45] Date of Patent: Mar. 5, 1991

[54] OPTICAL ENCODER WITH INACTIVE PHOTODETECTORS

[75] Inventors: Howard C. Epstein, Los Altos; Thomas J. Lugaresi, Campbell; Michael A. Robinson, Sunnyvale, all of Calif.

[73] Assignee: Hewlett-Packard Company, Palo Alto, Calif.

[21] Appl. No.: 449,202

[22] Filed: Dec. 11, 1989

Related U.S. Application Data

[62] Division of Ser. No. 290,542, Dec. 27, 1988.

[51] Int. Cl.$^5$ .............................................. H01J 40/14
[52] U.S. Cl. ........................... 250/214 C; 250/231.14; 250/237 G
[58] Field of Search .......... 250/214 C, 231.16, 237 G, 250/231.14; 341/13; 358/213.16, 213.13, 213.15, 213.23

[56] References Cited

U.S. PATENT DOCUMENTS

| | | | |
|---|---|---|---|
| 4,293,877 | 10/1981 | Tsunekawa et al. | 358/213.16 |
| 4,630,121 | 12/1986 | Suzuki et al. | 358/213.13 |
| 4,675,549 | 6/1987 | Steffe et al. | 358/213.23 |
| 4,691,101 | 9/1987 | Leonard | 250/231 SE |
| 4,763,197 | 8/1988 | Masuda | 358/213.15 |

Primary Examiner—David C. Nelms
Assistant Examiner—Stephone B. Allen

[57] ABSTRACT

An optical shaft angle encoder has a plurality of active photodiodes in an array on a semiconductor chip. A rotary code wheel has alternating areas for alternately illuminating or not illuminating the active photodiodes in response to the rotation of the wheel. Errors in the duty cycle involving the end active photodiodes in the array are largely avoided by having a plurality of inactive photodiodes at each end of the array with width and electrical properties effectively the same as the active photodiodes so that leakage current to each end active photodiode of the array is substantially equal to the leakage current to active photodiodes remote from the end of the array. Similarly, leakage current may affect the duty cycle of individual photodiodes may be minimized by surrounding the individual photodiodes with a reverse biased photodiode junction.

6 Claims, 4 Drawing Sheets

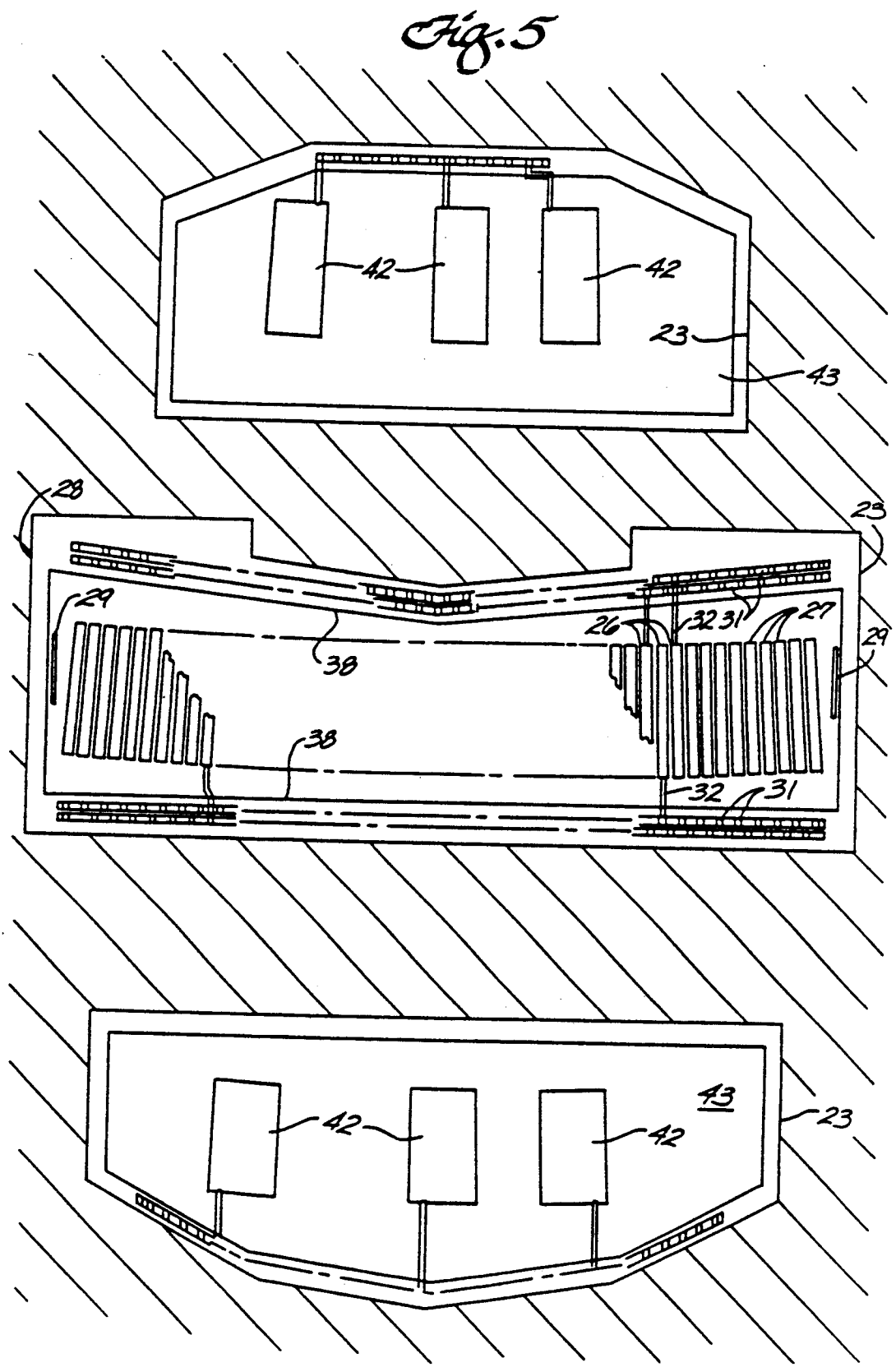

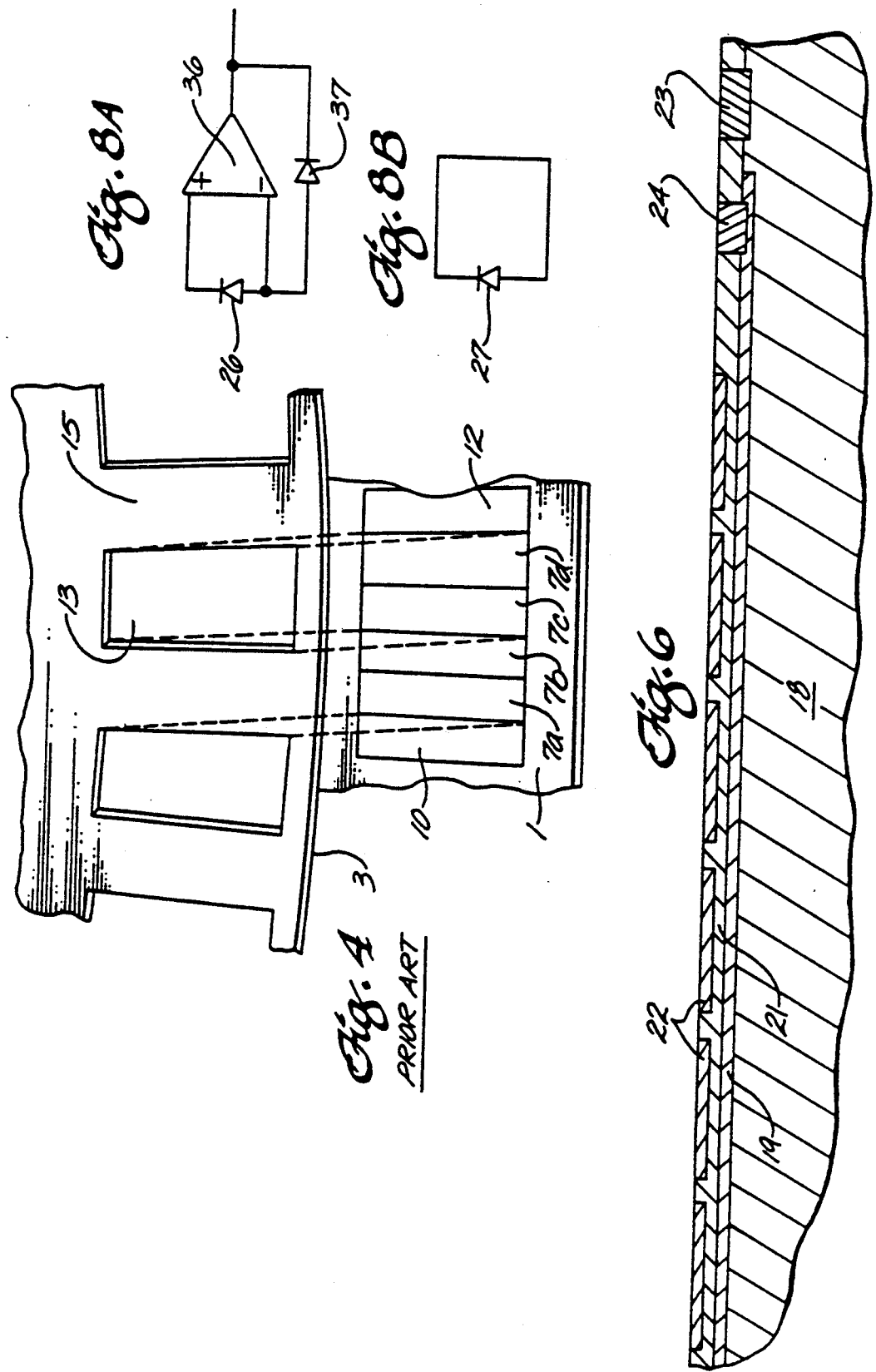

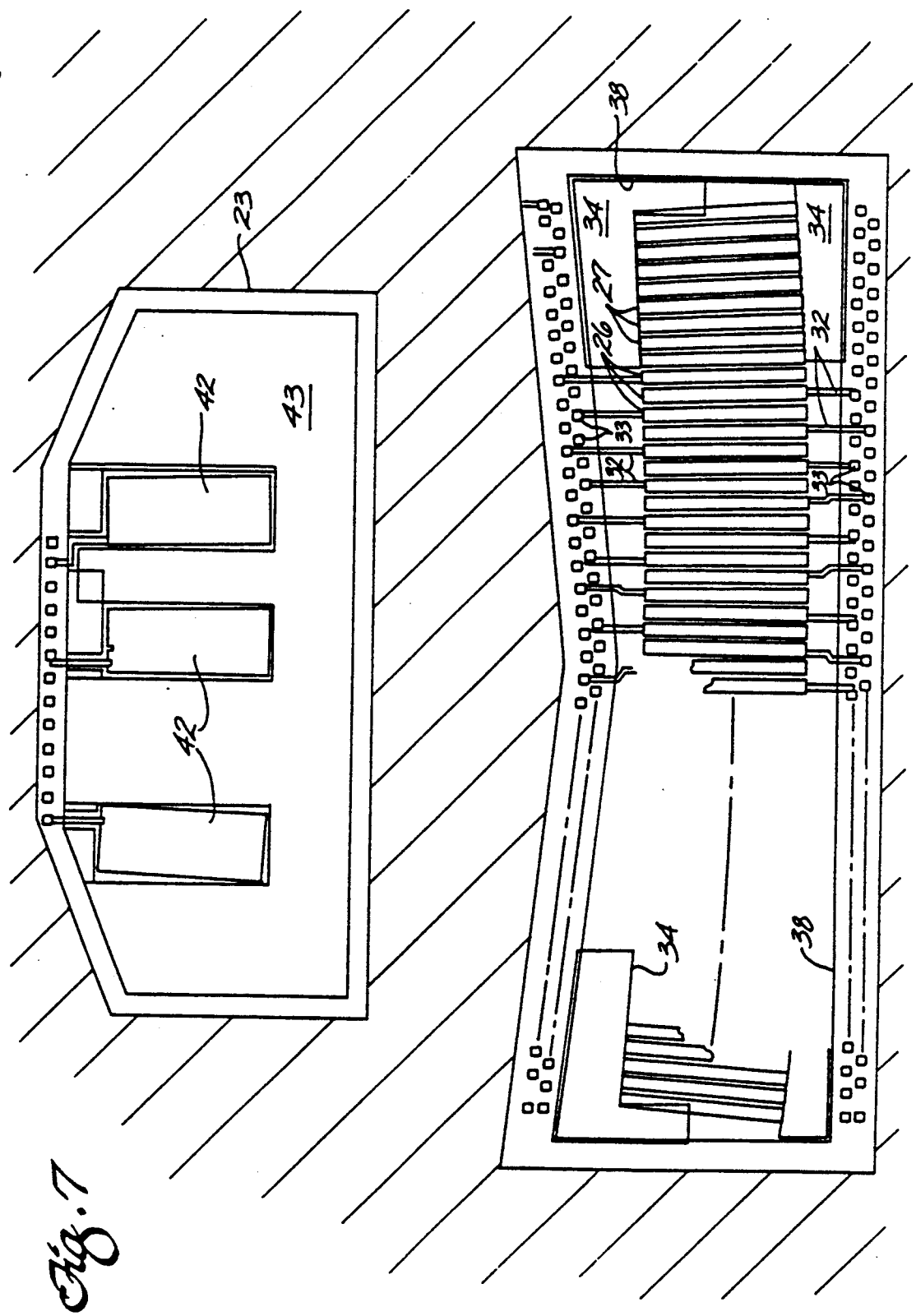

OPTICAL ENCODER WITH INACTIVE PHOTODETECTORS

CROSS REFERENCE TO RELATED APPLICATION

This is a division of application Ser. No. 290,542, filed Dec. 27, 1988.

BACKGROUND OF THE INVENTION

This invention relates to position sensors or encoders such as an optical shaft angle encoder which produces electrical signals indicative of the angular position of the shaft. In particular, it can improve accuracy by balancing leakage currents to photodiodes which detect changes in position.

Incremental optical motion encoders are used to resolve the position and movement of an object along a particular route. Such encoders generally include a light source for emitting a light beam, light modulation means for modulating the light beam in response to movement of the object along the route and a detector assembly for receiving the modulated light and producing electrical signals indicating the amount of light received by the detectors. As the light is modulated in response to the movement of the object, each electrical signal from the detector assembly produces a wave form. The position of the object along its route determines the position of each signal on its particular wave form; that is, the phase of each signal. Thus, the electrical signals from the detectors can be used to indicate the change in location of the object along the route. Two or more properly out-of-phase signals from separate detectors can be used to indicate both change in location and direction of movement.

For an incremental motion encoder to produce an indication of the absolute position or location of the object along its route, an index pulse is generated at least once along the route. The incremental signals can be used to count incremental movement from the index pulse and if the position of the object is known at the index pulse, the absolute position of the object at any place along the route can be determined. Thus, to provide an indication of absolute position, change in location, and direction of movement, an incremental encoder generally requires three channels of information. Two channels are derived from two or more out-of-phase encoder signals that are produced throughout the route of the object and the third is an index signal that is produced at least once along the route and at a known position of the object.

In an exemplary embodiment, such a position encoder or movement detector may be used for measuring the angular position of a shaft. Depending on the use of such a shaft angle encoder, a high degree of resolution and accuracy may be needed. It is not unusual to specify a resolution of 2,000 increments per revolution of the shaft. Accuracy of the correlation between the signal from the encoder and the actual mechanical position of the shaft or other object is also of importance. Mechanical alignment discrepancies in assembling apparatus can adversely affect accuracy. It has also been found that electrical effects can degrade accuracy.

An optical encoder useful for an understanding of this invention is described in U.S. Pat. No. 4,691,101, by Leonard, the subject matter of which is hereby incorporated by reference. FIGS. 1 to 4 are from that patent. FIGS. 1 to 3 are common to practice of this invention as much as practice of the invention in the Leonard patent. FIG. 4 is representative of the prior art as represented by the Leonard patent.

In an embodiment of this invention as illustrated in FIGS. 1 to 3, an encoder module 1 provides a collimated light beam and has light detectors 7 to receive the light beam after it has been modulated by a code wheel 3. A light emitting diode 9 provides light having a wavelength of approximately 700 nanometers, however, any frequency of electromagnetic radiation having a wavelength substantially shorter than the relevant dimensions of the encoder may be utilized. An emitter lens 11 is positioned to receive the light from the LED 9 and provide a collimated beam of light.

The code wheel 3 is concentrically mounted on a shaft 5 to rotate with the shaft and modulate the light beam with its optical track 17. The optical track has alternating transmissive sections 13 and nontransmissive sections 15 of equal width. One transmissive section and one nontransmissive section make up one pitch of the code wheel. As the wheel rotates, the alternating sections permit light from the LED to pass or not pass, thereby illuminating or not illuminating the photodetectors 7.

In an exemplary embodiment the code wheel has 500 transmissive sections and an equal number of nontransmissive sections. These sections have a trapezoidal shape since they are located immediately adjacent to one another on a circular track. An exemplary nominal width of each transmissive section is 62 microns, and the radial length of each section is 750 microns. The code wheel is made of an optically opaque material, such as stainless steel, and has a diameter of approximately 22 millimeters. The transmissive sections may be holes masked and etched through the disk.

In one embodiment illustrated in the Leonard patent and reproduced in FIG. 4, there are several groups of four light detectors 7a to 7d. A group of four light detectors has approximately the same size and shape of one transmissive section 13 and one nontransmissive section 15 on the code wheel. Individual light detectors 7a to 7d have a trapezoidal shape with an exemplary maximum width of 33 microns, a minimum width of approximately 29 microns with a gap of about 8 microns between individual light detectors.

The light detectors are photodiodes fabricated on a semiconductor chip using standard bipolar semiconductor technology. As illustrated in FIG. 4, a group of light detectors are placed in a one dimensional array as close to one another as the bipolar semiconductor technology will allow. Dummy photodiodes 10 and 12 are located on each end of the array to minimize the effect of stray light on the functioning light detectors 7a to 7d. In a shaft angle encoder, the photodiodes are in an arc having the same radius as the track 17 on the code wheel.

With such an arrangement of four light detectors, four output signals are produced having the same shape but offset from one another by multiples of 90 degrees (electrical degrees). These four signals in quadrature are compared for determining the amount and direction of rotation of the code wheel.

In an embodiment as mentioned in the Leonard patent there are seven groups of four light detectors. The signals from the "a" detectors in all the groups are combined. Similarly, all of the signals from the seven "b" detectors are combined, etc. By having plural groups, a larger detector area is illuminated for greater signal strength while still maintaining high resolution. Regardless of the number of groups, there are four signals and two channels of information. Commercial embodiments have been built with 12 groups of four detectors each. In such an embodiment, 48 active detectors are arrayed in an arc with one dummy photodetector at each end.

As described in the Leonard patent, one channel of output information is obtained by summing the outputs of the "a" and "b" detectors, and comparing that with the sum of the outputs of the "c" and "d" detectors. The other channel of information is obtained by comparing the sum of the "b" and "c" detectors with the sum of the "a" plus "d" detectors. The relevant logic equations are $a+b>c+d$ and $a+d>b+c$.

A source of error in accuracy of the correlation between the actual position of the code wheel and the electrical signals, is a so-called duty cycle error. The logical output of each channel of information should be one state (for example, ON) for 180 degrees (electrical) and the other state (OFF) for 180 degrees. This permits accurate location of the beginning and end of each transition between illuminated and not illuminated. A duty cycle error occurs when the two states are not each 180 degrees but are appreciably different from each other. Under those circumstances, the actual position of the code wheel cannot be known with the same accuracy.

There are times when it is desirable to reduce the number of groups of photodetectors for manufacturing, processing, and testing considerations. In such embodiments it is sometimes found that duty cycle errors of as much as 35 electrical degrees, may occur. It is desirable to provide means for reducing such duty cycle errors. It is also desirable to provide such a technique in a single step in the process for fabricating the semiconductor chips on which the photodetectors are formed.

BRIEF SUMMARY OF THE INVENTION

There is, therefore, provided in practice of this invention according to a presently preferred embodiment, an optical encoder comprising a plurality of active photodiodes in an array on a semiconductor chip for illumination or nonillumination in response to movement of a code member such as a code wheel. Means are connected to the active photodiodes for measuring the illumination. The response of the active photodiodes is kept uniform by providing sufficient inactive photodiode area on the semiconductor chip at each end of the array of active photodiodes to make the leakage current to the end active photodiodes of the array substantially equal to the leakage current to active photodiodes remote from the end of the array. Preferably this is provided by having an equal plurality of inactive photodiodes at each end of the array of active photodiodes with each inactive photodiode having a width and electrical properties effectively the same as the active photodiodes.

DRAWINGS

These and other features and advantages of the present invention will be appreciated as the same becomes better understood by reference to the following detailed description when considered in connection with the accompanying drawings, wherein:

FIG. 4 is a fragmentary view of the code wheel and a group of photodetectors as provided in the prior art and described hereinabove;

FIG. 5 is a partly schematic face view of a portion of a semiconductor chip on which photodiodes are arrayed;

FIG. 6 is a fragmentary schematic cross-section through a portion of such a semiconductor chip;

FIG. 7 is a partial face view of the "base" areas diffused into such a semiconductor chip; and FIGS. 8A and 8B are schematic circuit diagrams for a fragment of the semiconductor chip.

DESCRIPTION

Figure 1:
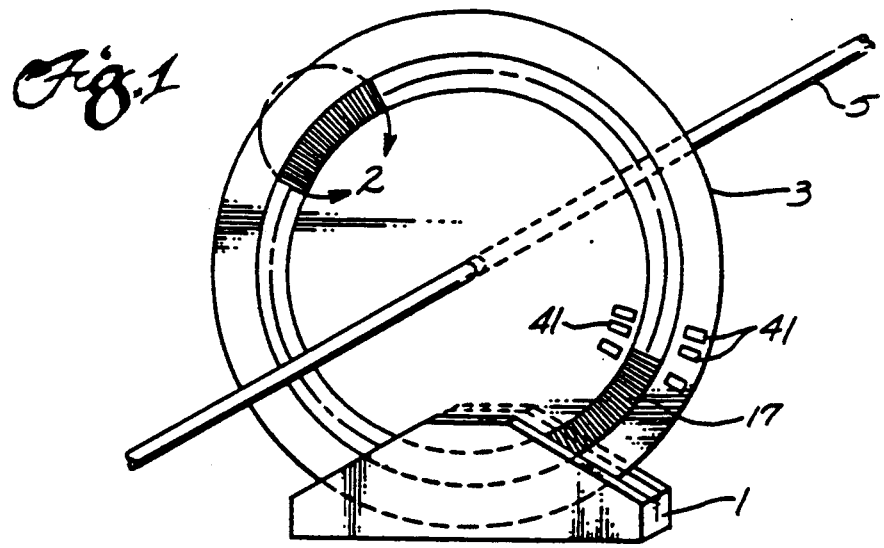
FIG. 1 is an isometric view of an exemplary shaft angle encoder constructed according to principles of this invention.
Figure 2:
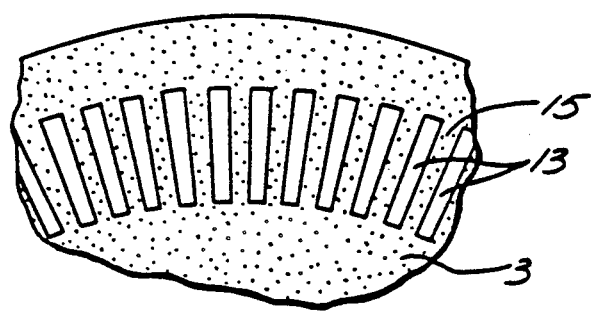
FIG. 2 is an enlarged view of a portion of the optical track on the code wheel of the shaft angle encoder.
Figure 3:
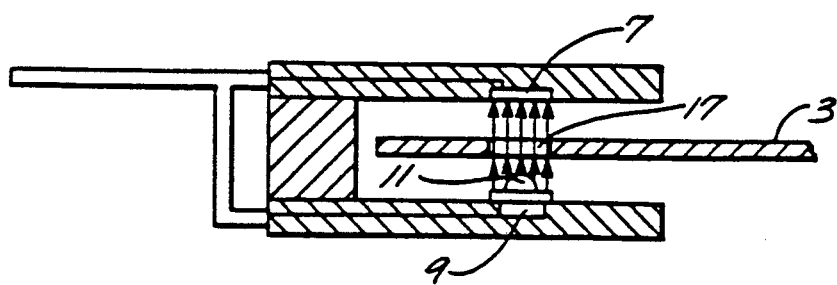
FIG. 3 is a transverse cross-section of the photodetector module and a fragment of the code wheel of FIG. 1.

FIGS. 1 to 3, as described hereinabove, illustrate a typical shaft angle encoder suitable for use in practice of this invention. This is a convenient embodiment for purposes of exposition. It will be understood, however, that principles of this invention may be used in other incremental optical motion encoders such as linear encoders. It will also become apparent that some aspects of this invention may be employed with other embodiments of integrated optics such as optical receivers where leakage currents may have an effect.

It has been discovered that a substantial duty cycle error may occur when a small number of sets of photodiodes are used. The error is aggravated on the information channel having the logic equation $b+c>a+d$. It was found that current leakage from outside the photodiode arrays was greater for the end photodiodes in the array than for photodiodes further from the end of the array, despite the presence of a dummy photodiode at each end of the array as mentioned in the Leonard patent.

Leakage current is a current that results from light generated minority carriers being produced outside the depletion region of the photodiode junction. Such minority carriers may drift to active photodiode junctions and contribute to the current flow, and hence, to the apparent light flux.

Means are therefore provided for equalizing leakage current differences by assuring that each active photodiode in the array has substantially symmetrical boundary conditions in each direction along the length of the array. Thus, the leakage current to the end photodiodes is substantially the same as the leakage current to photodiodes remote from the end of the array.

Preferably, this is accomplished by providing a plurality of inactive photodiodes at each end of the array, with each of the inactive photodiodes having a width and electrical properties effectively the same as the active photodiodes in the array. Such an array is illustrated in FIG. 5, which is a partly schematic view of the face of a representative semiconductor chip on which photodiodes, transistors, electrical leads, and the like, are fabricated for forming the electronic circuitry of an optical encoder. Three areas of the chip are of interest in practice of this invention, with two of the areas being substantially similar to each other. The balance of the area on a representative chip is filled with conventional transistors and other components of the circuitry which form no part of this invention. Those portions of the chip are therefore indicated only with diagonal shading. It will be understood, however, that those portions of the chip occupied by transistors and the like are made in the same processing steps as the photodiodes employed in practice of this invention. The processes are conventional techniques for forming bipolar integrated circuits.

Typically, a semiconductor chip comprises a substrate 18 (FIG. 6) of single crystal silicon or other semiconductor material. One face of the chip is modified by diffusion or implantation of impurities to affect the conduction properties of the silicon. In this case, a relatively high conductivity N doped buried layer 19 is formed in the silicon substrate for making electrical connections. A layer of lightly doped N-type epitaxial silicon 21 is deposited on the substrate. Selected areas of the epitaxial layer are doped with electron donors to form a highly doped N-type material in electrical contact with the buried layer.

Dopants are then diffused into selected areas of the N-type material to form P-type material. Although not material to practice of this invention, N-type dopants are then diffused into such P-type regions for forming NPN transistors, or the like. Those transistors may be connected so that the N-type epitaxial layer forms the collector. A P-type area forms the base of the transistor and the final N-type material forms the emitter.

Since formed by the same processes used in forming the transistors, in the photodiodes described herein, the N-type epitaxial layer may be considered as a "collector" and the photodiodes 22 are formed of P-type "base" material. It will be apparent that polarities may be reversed and the epitaxial layer may be considered an emitter. Thus, the terms collector and base are used herein for purposes of exposition, rather than as terms of limitation.

Various areas on the semiconductor chip are isolated from each other by introducing dopants to form a high conductivity electrical isolation barrier 23. The isolation barrier is typically connected to electrical ground and isolates transistors from each other, and in this case, isolates photodiodes from areas occupied by transistors. In the jargon of the industry, the area within an electrical isolation barrier is sometimes referred to as a "tub". In the bipolar technology described herein, the isolation barrier is somewhat like two opposite diodes which provide electrical isolation. In CMOS technology, other electrical isolation barriers may be used.

High conductivity electrical connection regions 24 may also be introduced for making electrical connection from the surface of the epitaxial layer to the buried layer.

After forming the various electrically conductive regions in the semiconductor chip, the surface is covered with silica or glass, and metal electrical leads are applied for making electrical connections to various areas of the chip (not shown in the drawings). It is conventional to apply a passivation layer over the entire chip, including the metal leads, for environmental protection when the chip is completed. If desired, an opaque layer (for example, of metal) may be deposited on the chip to provide a light mask for components on the chip. Such a mask may be applied over transistors in the circuit, for example, so that they are not photosensitive.

Such fabrication of bipolar devices on a semiconductor chip is, of course, quite conventional. It will also be understood that these manufacturing techniques are appropriate for the bipolar devices used in describing this invention, and for CMOS other technologies may be employed for fabricating suitable semiconductor chips.

It is desirable to economize on manufacturing costs of semiconductor chips by forming chips for various models of shaft angle encoders, or the like, on similar substrates with similar electrical isolation barriers, buried layers, collectors, and the like, with the differences between various models being restricted to the base layer. Thus, the same masks may be used for a variety of different models, with the differences being only in the masks employed for the base layer. In keeping with this, FIG. 5 illustrates a face of the semiconductor chip with a variety of somewhat superimposed features, and FIG. 7 is limited to a showing of the base layer for a representative chip made in accordance with practice of this invention.

In this embodiment, there is an area or tub in which photodiodes 26, 27 are arrayed and isolated from the balance of the chip by an isolation barrier 28. Near each end of the photodiode tub, there is a high conductivity region 29 implanted for making electrical contact to a buried layer (FIG. 6) which makes good electrical contact with the epitaxial collector layer. Four metal buses 31 on top of glass insulation (not shown) provide electrical contact for the four photodiodes in each of the several groups of photodiodes in the tub; there being eight groups in the illustrated embodiment. As can be better seen in FIG. 7, narrow "leads" 32 of base layer extend from each active photodiode 26 to a pad 33 to which electrical contact can be made by the respective metal bus.

In the exemplary embodiment, there are a plurality of active photodiodes 26 which are connected to the metal buses. In this case, there are thirty-two active photodiodes, in eight groups of four each as described hereinabove and in the Leonard patent. At each end of the array of active photodiodes, there is a plurality of additional inactive photodiodes 27; nine at each end in the illustrated embodiment. Each of the inactive photodiodes is formed of the base layer so as to have the same width and electrical properties as the active photodiodes. The inactive photodiodes are shorted together by pads 34 of base layer, one of which is connected to the high conductivity area 29 leading to the buried layer and, hence, the collector. In other words, the inactive photodiodes are electrically shorted to themselves as indicated in FIG. 8B.

A comment can be made about the appearance of the base layer as illustrated in FIG. 7. In this drawing, it appears that the leads 32 are separate entities from the active photodiodes 26 and the connection pads 33, or that the larger pads of base layer 34 are separate from the inactive photodiodes 27. There is, however, continuity between those base areas. The drawing is left with what appear to be overlapping base areas, since it is believed to be clearer than if the overlapping lines were deleted. The reason for this configuration is that the base diffused areas are defined by plural exposures to form the mask for defining the base areas, with some parts of the plural exposures overlapping. Thus, for example, the base areas forming all of the photodiodes and the connection pads 33 are defined by one exposure to form the mask and the leads 32 and connection pads 34 are defined in a second exposure.

The electrical connection of the active photodiodes is the same as in an encoder as described in the Leonard patent and in various commercial embodiments. Each of the similar photodiodes in the several groups are connected to the same metal bus so that their currents are additive. Each metal bus is in turn connected to an operational amplifier 36, the other lead of which is connected to the common collector for all of the photodiodes. The feedback for the operational amplifier employs a diode 37. By connecting the active photodiodes across an operational amplifier, the voltage across the active photodiodes is essentially zero and the voltage of the shorted inactive photodiodes is, therefore, the same.

As indicated above, the duty cycle where the outside photodiodes in a group are compared with the inside photodiodes of a group may not be symmetrical, thereby introducing an accuracy error. It has been found that the apparent source of this error is leakage current from outside the array of active photodiodes being different from leakage current from within the area occupied by active photodiodes.

A substantial portion of the tub in which the array of photodiodes is placed is illuminated during operation of the encoder. A line 38 is shown in FIG. 5 around the area occupied by the photodiodes, and within the boundaries of the tub (as defined by the electrical isolation barrier 28). Areas outside the line 38 have an opaque coating of metal applied over the passivation layer, and areas inside the line remain exposed to illumination. This illumination generates hole and electron pairs, not only in the depletion region of the base-collector junction of the photodiodes, but also in the collector material.

The holes have a relatively long lifetime and may diffuse laterally to be additive with current from the active photodiodes. The leakage current may arise from collector beneath the base layer of the photodiodes, from the small amount of collector layer exposed between adjacent photodiodes, and from portions of the tub exposed to light outside of the array of active and inactive photodiodes.

To make the leakage current to the end active photodiode in the array the same as the leakage current to an active photodiode remote from the end of the array, a plurality of inactive photodiodes 27 are provided at each end of the array. With the leakage to the end and inner active photodiodes being equal, a source of duty cycle error is eliminated. The inactive photodiodes have a width, spacing and electrical properties substantially the same as the active photodiodes. A sufficient number of such inactive photodiodes are provided at each end of the array that the end photodiode is located in what is effectively a symmetrical array. Thus, there are a sufficient number of inactive photodiodes between each end active photodiode and the edge of the illuminated area that the leakage current from these inactive photodiodes to the end photodiode is substantially the same as the current leakage to the active photodiode from the other active photodiodes in the array. In other words, the leakage current to each of the active photodiodes in the array is substantially the same. This symmetry minimizes duty cycle error.

The number of inactive photodiodes at each end of the array is a function of a number of factors. Generally speaking, it is desirable to have as many inactive photodiodes as possible so that the array of inactive photodiodes extends to the edge of the illuminated area in the tub.

A factor in selecting the number of photodiodes to give the desired equality of leakage current for the end and inner photodiodes is the number of groups of photodiodes connected together by the metal buses for each channel of information. The larger the number of such groups, the less significant the current leakage problem is, since the effect on the end photodiode is essentially averaged with the other photodiodes with which it is connected. Similarly, the size of the tub, or at least the illuminated area of the tub, also has an effect. The larger the illuminated area, the more inactive photodiodes are desirable. As indicated above, it is preferable to essentially fill the tub or its illuminated area with the active and inactive photodiodes.

The thickness and properties of the epitaxial layer forming the collector are also factors. A thicker layer permits the current carrying holes to diffuse further laterally before being swept up by the junction of an inactive or active photodiode. Electrical properties of significance include the lifetime of the holes (longer lifetime requiring more inactive photodiodes) and the ability to form electron-hole conduction pairs in the collector material. This latter is also a function of the frequency of light used in the encoder since the absorption coefficient of the semiconductor varies with frequency. The widths of the active and inactive photodiodes and the space between adjacent photodiodes also have an effect. Shallower photodiode junctions tend to produce greater leakage current as do wider strips of exposed collector between adjacent photodiodes.

It should be noted that the decrease in leakage current carriers from the outside of the array of inactive photodiodes decreases exponentially. This tends to reduce the number of inactive photodiodes required to obtain substantial symmetry of boundary conditions for all of the active photodiodes, since only a fraction of the leakage current to each photodiode diffuses in turn to the following photodiode. For example, in one embodiment the minimum number of inactive photodiodes is four. It is also desirable to have symmetry so that the number of inactive photodiodes at each end of the array of active photodiodes is the same.

It should also be noted that current leakage from the ends of the elongated photodiodes is not a significant problem since the areas at the ends of all the photodiodes from which current may leak is approximately equal. In other words, the boundary conditions at the ends of all of the active photodiodes are about equal. Further, having small areas near the edge of the illuminated area which are not occupied by inactive photodiodes has little effect since the leakage current falls off exponentially.

Although it is preferable to employ a plurality of inactive photodiodes which are essentially similar to the active photodiodes at each end of the array of active photodiodes, it is also feasible to provide an active photodiode area at each end which is sufficiently wider than each of the active photodiodes that the leakage current to the end active photodiode in the array from the inactive photodiode area is approximately equal to the leakage current to the end active photodiode from the balance of the active photodiode array. If the difference between those leakage currents is kept small, the duty cycle error is minimized.

In other words, the inactive photodiode area at each end of the array to provide symmetry of leakage current may be a base area entirely connected together without any exposed collector or it may be a plurality of base areas with intervening strips of exposed collector as shown in FIGS. 5 and 7.

An embodiment with a single large area is somewhat harder to implement in practice, since the factors implicated in leakage current include a number of variables and the desired symmetry may be hard to achieve. Thus, it is preferable to employ a plurality of inactive photodiodes at each end of the array rather than a single large area.

As mentioned above, it may be desirable to provide light shielding for parts of the tub in which the photodiode array is located. This tends to improve duty cycle error. However, shielding all of the area outside of the array of active photodiodes is counterproductive since the end active photodiodes then see less leakage current than active photodiodes remote from the end of the array, thereby increasing duty cycle error.

As mentioned hereinabove, index apertures 41 are provided on the code wheel for indicating the absolute position of the code wheel. Preferably, a plurality of such apertures are formed on a circumferentially extending track radially inwardly from the optical track 17, and another plurality of index apertures are provided radially outwardly from the optical track. Similarly, a plurality of photodiodes 42 are provided in each of two tubs 43 radially inwardly and radially outwardly from the array of photodiodes 26 and 27.

It is found that such index photodiodes may also be sensitive to leakage current, which, if unbalanced between the inner and outer tracks of photodetectors, leads to duty cycle errors and uncertainty in the absolute position of the code wheel. In practice of this invention, the magnitude of such leakage currents is greatly reduced by providing a layer of base diffusion 44 which closely surrounds the index photodiodes and essentially fills all illuminated areas of the tub in which the index photodiodes are fabricated.

A portion of the base layer filling the balance of the illuminated area extends laterally to make electrical contact with the isolation barrier. This causes a reverse bias on the photodiode junction between the inactive base layer 44 and the underlying collector. Because of the surrounding reverse biased junction, there is little leakage current from most of the tub to the index photodiodes and significant improvements in duty cycle are obtained.

Although it is preferred to reverse bias the photodiode junction surrounding the index photodiodes, it will be apparent that improvement in leakage current is also obtained by shorting the base of the inactive photodiode area to its collector. What is to be avoided is a forward bias of the surrounding photodiode junction.

It will be appreciated that this means for shielding a photodiode from leakage current is not only useful in a shaft angle encoder or other movement encoder but would also be useful in other integrated optics where photo-responsive features are fabricated on a semiconductor chip.

Although one principal embodiment of encoder has been described and illustrated herein, many modifications and variations will be apparent to those skilled in the art. For example, the number of photodiodes in each group may be six instead of four, or the number of groups may be increased or decreased as desired for a particular application to obtain the desired resolution, accuracy and contrast. The number of inactive photodiodes added at each end of the array of active photodiodes may be varied to obtain the desired degree of equality between the leakage current to the end photodiode in the array as compared with the leakage current to a photodiode remote from the end of the array. Although described in the context of a bipolar construction on a silicon substrate, other techniques and semiconductor materials may be employed. Further, although as described herein the photodiodes are not biased, it may be desirable in some embodiments to reverse bias the photodiodes to enhance light-current conversion efficiency and sensitivity.

Many other modifications and variations will be apparent and it is therefore to be understood that within the scope of the appended claims the invention may be practiced otherwise than as specifically described.

What is claimed is:

1. Means for shielding a photodiode from leakage current comprising:
   at least one active photodiode on a semiconductor chip;
   means for measuring current from the active photodiode;
   a shielding area having a photodiode junction substantially surrounding the active photodiode; and
   means for biasing the shielding area photodiode junction with either zero bias or reverse bias.

2. Means for shielding as recited in claim 1 further comprising means for reverse biasing the shielding area photodiode junction.

3. Means for shielding as recited in claim 2 further comprising:
   an electrical isolation barrier separating the area of the semiconductor chip containing the active photodiode from other areas of the semiconductor chip; and wherein
   the shielding photodiode junction occupies substantially the entire area within the isolation barrier not occupied by the active photodiode.

4. Means for shielding as recited in claim 2 further comprising:
   an area on the semiconductor chip which is at least intermittently illuminated, the active photodiode being in the illuminated area; and wherein
   the shielding area photodiode junction occupies substantially the entire illuminated area not occupied by the active photodiode.

5. An optical encoder comprising:
   a plurality of distance measuring photodiodes in an array on a semiconductor chip;
   a code member having alternating areas for alternately illuminating and not illuminating the distance measuring photodiodes in response to movement of the code member;
   at least one index photodiode on a separate track from the array of distance measuring photodiodes;
   at least a portion of the area on the semiconductor chip around the index photodiode also being illuminated in response to movement of the code member; and characterized by
   the principal balance of the illuminated area not occupied by an index photodiode being a shielding photodiode.

6. An optical encoder as recited in claim 5 wherein the shielding photodiode is doped the same as the index photodiode, and the shielding photodiode is electrically connected to ground.

* * * * *